United States Patent [19]

Henry et al.

[11] Patent Number: 4,940,901
[45] Date of Patent: Jul. 10, 1990

[54] X-RAY IMAGING DEVICE

[75] Inventors: Yves Henry, Eybens; Marc Arques, Grenoble, both of France

[73] Assignee: Thomson-CSF, Paris, France

[21] Appl. No.: 268,262

[22] Filed: Nov. 7, 1988

[30] Foreign Application Priority Data

Nov. 10, 1987 [FR] France .................... 87 15534

[51] Int. Cl.⁵ ................. H01L 27/12; G01T 1/208
[52] U.S. Cl. ...................... 250/370.09; 250/370.11
[58] Field of Search ................. 250/370.11, 370.09

[56] References Cited

U.S. PATENT DOCUMENTS

| 4,288,264 | 9/1981 | Haque | 156/67 |
| 4,317,037 | 2/1982 | Suzuki et al. | 250/367 |
| 4,598,203 | 7/1986 | Umetani et al. | 250/366 |
| 4,803,359 | 2/1989 | Hosoi et al. | 250/327.2 |
| 4,810,881 | 3/1989 | Berger et al. | 250/370.01 |

FOREIGN PATENT DOCUMENTS 0125691 11/1984 European Pat. Off. .

OTHER PUBLICATIONS

Patent Abstracts of Japan, vol. 2, No. 129(E-78), Oct. 27, 1978, p. 7849 E 78; & JP-A-53 96 787.
Patent Abstracts of Japan, vol. 2, No. 129(E-78), Oct. 27, 1978, p. 7849 E 78; & JP-A-53 96 785.
Patent Abstracts of Japan, vol. 7, No. 253(P-235)[1398], Nov. 10, 1983; & JP-A-58 137 782.
Patent Abstracts of Japan, vol. 2, No. 129(E-78), Oct. 27, 1978, p. 7851 E 78; & JP-A-53 96 791.
Patent Abstracts of Japan, vol. 9, No. 68(P-344)[1791], Mar. 28, 1985; & JP-A-59 200 983.

Primary Examiner—Constantine Hannaher
Attorney, Agent, or Firm—Oblon, Spivak, McClelland, Maier & Neustadt

[57] ABSTRACT

The disclosure concerns devices for the conversion of images into electronic signals with particular application to X-ray imaging. Instead of forming, on an insulating glass substrate, a strip or matrix of photosensitive elements (PIN diodes) which are then coated with a scintillating sheet bonded to or pressed against the upper surface of the photosensitive elements, a scintillating layer is deposited on the substrate before forming the photosensitive elements. Thus, a gain in sensitivity and definition is achieved. It is moreover possible to preserve, in addition to the scintillating layer deposited between the substrate and the photosensitive elements, a scintillating layer bonded to or pressed against the upper surface of the unit. The two scintillators may be identical or different in nature. If they are different, they may react to different wavelengths but may also emit in different wavelengths.

8 Claims, 2 Drawing Sheets

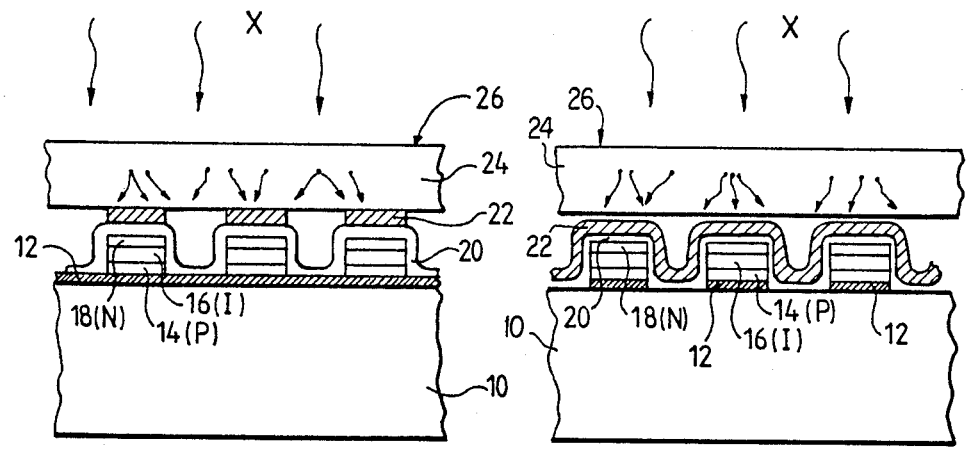
FIG.1a
*PRIOR ART*
FIG.1b
*PRIOR ART*
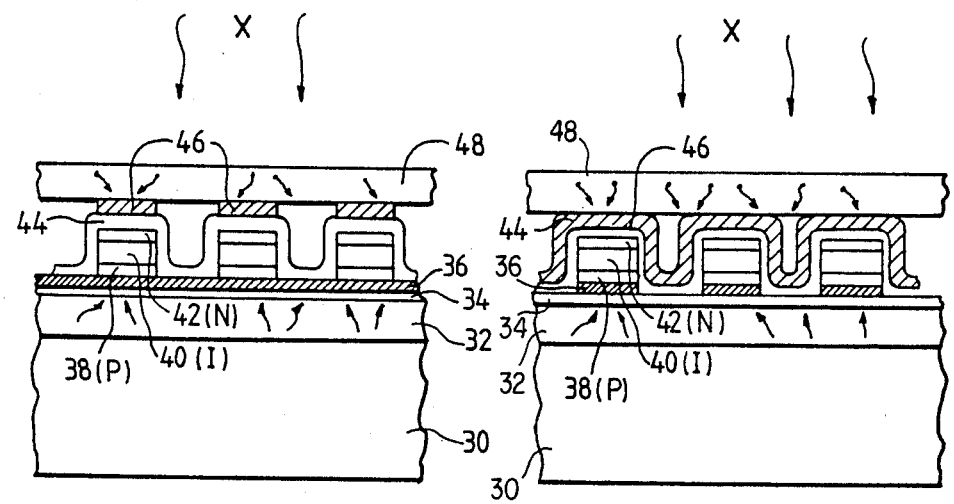
FIG.2a
FIG.2b

X-RAY IMAGING DEVICE

BACKGROUND OF THE INVENTION

1. Field of the Invention

The invention concerns the preparation of X-ray pictures by means of photosensitive elements associated with a scintillator.

A scintillator is a substance with the property of being excited by X-rays and of emitting, in response to this excitation, a radiation with a wavelength in the visible or near visibible range. Photosensitive elements give an electrical signal when they receive this visible radiation, whereas they could not directly give an electrical signal in response to illumination by X-rays. Thus, an X-ray picture can be converted into a set of electrical signals representing this picture.

The invention shall be described only for this type of scintillator, which converts a range of very short wavelengths (X-rays) into a range of longer wavelengths (visible or near visible light), but it will be understood from the following description that the invention would be applicable to cases entailing the conversion of wavelengths which are different from those of the abovementioned particular case (provided that there a scintillating substance available to perform the desired wavelength conversion).

2. Description of the Prior Art

The devices hitherto used for the electrical reproduction of X-ray pictures have either a pinpoint photosensitive detection element or a linear strip of photosensitive elements or, again, a rectangular matrix of elements. The element or elements are generally photodiodes or phototransisdors formed on an insulating substrate, and they are coated with a sheet of scintillating material which is either bonded to the upper surface of the photosensitive elements (on the X-radiation input side) or simply applied by pressure to this upper surface.

FIGS. 1a and 1b show two mutually orthogonal, lateral sectional views of a matrix of photosensitive elements associated in a standard way with a scintillating sheet.

Each photosensitive element consists, for example, of a PIN diode (a PN junction with a central, intrinsic part) and the matrix network has column conductors and row conductors having, at each row and column intersection, a PIN diode in series with a charge storage capacitor. The column conductors 12 consist of a metal deposited and photo-etched on an insulating substrate 10, preferably made of glass. The PIN diode is formed by deposition, on the column conductors, followed by etching, of three layers of amorphous silicon. These three layers are respectively doped as follows: P type (layer 14), intrinsic type (layer 16) and N type (layer 18). An insulating layer 20 is deposited on all the PIN diodes, and this layer forms the dielectric of the capacitor. A preferably transparent conductor is deposited on the insulating layer 20 and etched to form the row conductors 22 of the matrix. Finally, a scintillating sheet 24 is bonded or applied by pressure to the upper surface of the structure.

The radiation to be converted, namely, the X-radiation in the case of X-ray imaging, arrives by the top and strikes the upper surface 26 of the scintillator. If it were to arrive by the bottom, it would have to go through the glass substrate, the row conductors and column conductors and photosensitve diodes. The result thereof, chiefly because of the glass, would be losses which it is sought to avoid in order not to lose any part of the data, especially the low level data.

The thicker the scintillator, the more photons are emitted under X-radiation. Ultimately, for infinite thickness, all the X-radiation is absorbed and is converted into light photons. But conversely, if the scintillator is too thick, the photons emitted from the side opposite the photosensitive detector will be absorbed in their path through the scintillator (which is not completely transparent) and would not reach the photosensitive detector. These photons will be unprofitably lost. A compromise thickness should generally be found. This thickness is in the range of about 200 micrometers.

Besides, for scintillators made in the form of compacted powder sheets, the definition is all the smaller as the sheet is thicker. For, the photons are emitted in all directions and, in fact, the photons emitted at a distance d from the photosensitive element produce a light spot with a density which is distributed according to a Gaussian relationship, the approximate useful diameter of this spot being substantially equal to the distance d. Here again, an excessive thickness has to be avoided and a compromise has to be found for the pair of parameters comprising definition and sensitivity.

The invention results from the observation that, in the structure of FIGS. 1a and 1b, that side of the scintillator which is first struck by the X-rays is the side 26 and not the side in contact with the photosensitive diodes. The result of this is that the greatest number of light photons is emitted on the side which is struck first.

Now, it is precisely those photons emitted on the further side of the surface of the photosensitive detector that tend to limit both sensitivity (because these photons do not all succeed in crossing the sheet) and definiion (because they are emitted far from the photosensitive surface).

An object of the invention is to improve both the definition and the sensitivity of the device, and to do so without it being necessary to use scintillators with very particular crystalline structures, deposited in the form of vertical needles (caesium iodide scintillators) providing high definition.

Another object of the invention is to facilitate the manufacture of the device in preventing accidents due to the brittlenes of the scintillating sheet which is very thin (about 200 microns).

SUMMARY OF THE INVENTION

According to the invention, it is proposed to make a device for the conversion of images into electrical signals, said device comprising, firstly, a photosensitive detector formed on an insulating substrate, and, secondly, a scintillating substance, wherein said scintillating substance is deposited on the insulating substrate before the photosensitive detector is formed, the scintillating substance being thereupon interposed between the substrate and the detector. The scintillating substance is a bonded sheet containing a scintillating powder or a compound which is deposited by spreading or sedimentation and is annealed. The detector is a strip of photosensitve elements or a matrix of elements. These elements are formed by the deposition of successive layers on the substrate which is coated beforehand with a layer of a scintillating substance. Preferably, an insulating, planarizing layer is deposited on top of the scintillating layer before the deposition of the photosensitive elements in order to compensate for small inequalities in the thickness of the scintillating layer, and to prevent the diffusion of dopant atoms in the semiconducting layers forming the photosensitive elements.

In one alternative embodiment, and with a view to increasing the sensitivity of the device, there is provision also for an ancillary scintillating sheet applied against the upper surface of the photosensitive detector so that the radiation to be converted first strikes this scintillating sheet, which emits radiation towards the detector, by the top, and so that the residual radiation to be converted (namely, the radiation which has not been absorbed by the sheet) strikes the scintillating substance deposited on the substrate, said scintillating substance emitting radiation towards the detector through by the bottom of this detector. It can also be provided that there will be scintillators with different absorption spectra to cover a wider range of wavelengths of radiation received.

Furthermore, it may be planned to interpose a reflecting mirror (for the wavelength emitted by the scintillator) between the insulating substrate and the scintillating substance deposited. This mirror sends the photosenstive detector the photons which might be emitted by the scintillator in the direction opposite to the detector.

BRIEF DESCRIPTION OF THE DRAWING

Other features and advantages of the invention will appear from the following detailed description, made with reference to the appended drawing, in which:

FIGS. 1a and 1b, already described, show a lateral section along two orthogonal directions of a prior art X-ray imaging device;

FIGS. 2a and 2b show lateral sections, along two orthogonal directions, of a matrix imaging device according to the invention.

DESCRIPTION OF A PREFERRED EMBODIMENT

Figure 3:
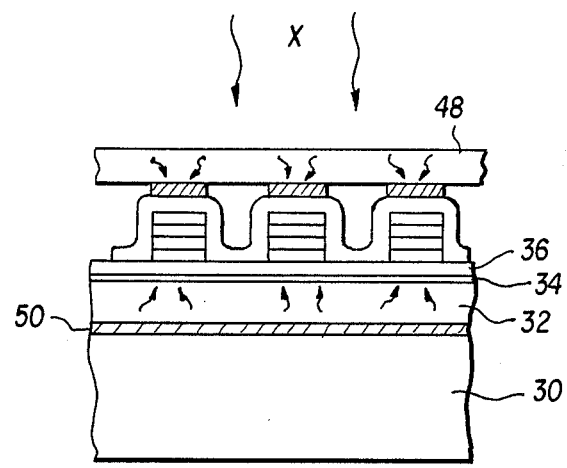
FIG. 3 and 4 show lateral sections of further embodiments of a matrix imaging device according to the invention.

The device according to the invention shall be described with reference to the method for its manufacture.

The manufacturing method starts with an insulating substrate 30 which is preferably made of a substance transparent to the wavelengths emitted by the scintillator in the application considered. This transparency is not absolutely necessary, but it may be valuable in applications where the photosensitive detector has to be periodically discharged by a light flash. For X-ray applications with photosensitive detectors made of amorphous silicon, a glass substrate will be preferably used.

For large-sized devices, for example with dimensions of several tens of centimeters square, the glass should be thick enough to be rigid: a thickness of several millimeters may be required, and it will be therefore understood that it is preferable to illuminate the device through the upper surface rather than through the glass which would absorb a fraction of the radiation.

On the insulating substrate 30, a scintillating substance 32 is deposited. This scintillating substance 32 is capable of converting radiation in a first range of wavelengths into radiation in a second range of wavelengths. The first range is that of the source of illumination by means of which is produced an image which it is desired to convert into electrical signals. The second range must correspond to the range of sensitivity of the photosensitive detector.

For example, gadolinium oxysulphide is capable of converting X-rays into green light radiation (about 550 nanometers). Amorphous silicon photosensitive detectors are sensitive to this green radiation.

The photosensitive substance may be deposited on the substrate in several possible ways.

One method consists simply in taking a standard scintillating sheet and in bonding it to the substrate with a bonder that is compatible with the processing temperatures which will be used in the subsequent stages. The sheet is formed, for example, by a duroplastic resin in which a scintillating powder such as gadolinium oxysulphide is buried. The sheet may also be made of an epoxy resin if the subsequent processing temperatures are low enough.

In another method, a viscous paste is spread (for example by pre-deposition or centrifugation) on the substrate. This paste consists of a binder mixed with a scintillating powder. The paste is heated to rid it of volatile solvents. The binder may an epoxy resin if no stability under temperature is required for subsequent stages. It may also be a polyimide, in which case the binder and the powder are mixed, the mixture is deposited and then, a polymerization (imidization) is done. Finally, the binder may be an inorganic (mineral) binder. For example, a mixture of scintillating powder and glass beads in suspension in a volatile solvent is used, and processing is done at high temperature (at about 500° C.) at which the glass beads enter into fusion with one another and with the substrate. This latter procedure is especially useful if subsequent processing operations are performed at temperatures exceeding 200° C.

The scintillating layer 32 has a thickness chosen to optimize the photon production efficiency without excessive loss of definition. This thickness may range from a few tens to a few hundreds of micrometers for X-ray imaging applications with gadolinium oxysulphide.

After the deposition and treatment of the scintillating layer 32, an intermediate insulating layer 34 is deposited. This intermediate layer 34 notably has the function of planarizing the upper surface of the layer 32 before the deposition of the photosensitive elements, and of forming a barrier to the diffusion of impurities between the scintillating layer and the photosensitive elements.

The intermediate insulating layer may be made of polymide, which is marketed, for example, under the reference Pi2555 by the firm DUPONT DE NEMOURS. It is deposited by centrifugation, after which it is completely polymerized after an annealing operation at 150° C. for one hour. Its thickness is about 2 to 10 micrometers.

Then, a thin layer 36 (about 100 nanometers) of a conductive material, transparent to the wavelength emitted by the scintillator, is deposited. This conductor may be indium-tin oxide. It is etched in a pattern of parallel columns.

The adhesion of the conductive material may be improved by a prior deposition of an intermediate thin layer (not shown). In the case of indium-tin-oxide, the adhesion may be improved by a layer, about 10 nanometers thick, of copper or chromium.

On the structure thus coated with conductive columns, a layer 38 of hydrogenated amorphous silicon is deposited by gas phase chemical vapor deposition (CVD) aided, if necessary, by light excitation in the ultra-violet range (photoCVD) so as to enable functioning at lower temperatures (below 150° C.).

The silicon layer 38 is doped with a P type impurity, preferably boron, as well as with carbon which has the advantage of making it more transparent to the photons emitted by the scintillator.

In the same way, a layer of intrinsic hydrogenated amorphous silicon 40 is then deposited.

Then, a layer of hydrogenated amorphous silcon 42 is deposited. This material is doped with an N type impurity, preferably phosphorus.

Thus, a succession of three layers, respectively of the P type, I (intrinsic) type and N type, has been made on top of the column conductors. Vertical PIN diodes could be made by means of these three layers. These diodes form the photosensitive elements proper, generating electrical charges in the presence of radiation of a visible wavelength.

The next step in the manufacturing method consists in an etching of three superimposed layers, 38, 40, 42 in a pattern of islets, each placed at the points of intersection of the rows and columns of a rectangular matrix. The columns of this matrix have already been defined and are the conductors of the layer 36.

Then the entire structure is coated with an insulating layer 44, made of silicon oxide or nitride for example, then with an upper conductive layer 46 which is etched to define the row conductors of the matrix.

If the device has only one scintillator, namely the layer 32, the conductive layer 46 may or may not be transparent. It may even be advantageous for it to be reflective (but transparent to X-rays) to bring, towards the PIN diode, those photons which might have crossed it without being absorbed. If, on the contrary, the device has a bottom scintillator (layer 32) and a top scintillator 48, similar to that of FIGS. 1a and 1b, it is necessary for the upper conductive layer 46 to be transparent, and it is then made like the layer 36, for example of indium-tin oxide.

In the type of photodetector matrix described herein as an example, each photodiode is made by stacking of vertical layers and is associated with a charge storage capacitor also stacked on top of the photodiode. This structure reduces the lateral space factor of each dot to the minimum. Here the capacitor consists of the insulating layer 44 between one of the two conducting regions, respectively the N region 42 of the photodiode and the row conductor 46. However, the invention will be applicable to other types of photodetector matrices, for example, photodiodes each associated with a TFT (thin film transistor) type of access transistor.

In an alternative embodiment shown in FIG. 3, a reflecting layer 50 is interposed between the scintillating layer 32 and the substrate. The layer 50 is capable of reflecting the wavelengths emitted by the scintillator 32 so that the photons emitted by the scintillating layer to the rear (towards the substrate 30) are sent on towards the PIN photodiodes. Thus there is a gain in the total efficiency of the structure, since a number of photons which would have otherwise been lost are converted into electrical charges. The reflecting layer may be a layer of aluminium deposited on the glass substrate before the scintillating layer 32 is deposited.

Should the structure also have a scintillator 48, bonded or pressed to the upper surface of the photosensitive elements, it can also be provided that this scintillator 48 will be coated with a reflecting layer (not shown), bonded to or deposited on the upper surface of the scintillator 48. This layer must reflect the photons emitted upwards by the scintillator 48. Otherwise these photons would not take part in the preparation of an electrical signal in the photodiodes. However, this layer must necessarily be highly transparent to incident X-rays. The layer may be made of aluminium.

In special applications, it may be planned that the bottom (32) and top (48) scintillators are different in nature and scintillate in response to different incident wavelengths. Thus, a wider spectrum of incident rays is covered.

Figure 4:
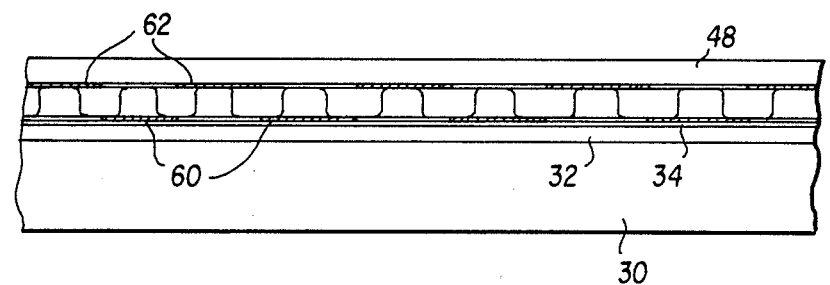

It can also be envisaged that these scintillators, sensitive to different wavelengths, emit in wavelengths which are also different, for example in red visible light and in green visible light. It may then be provided that every other photodetector element (or every other row or every other column) is allocated to one of the two wavelengths. This element is masked by a layer which is opaque to the other wavelength but transparent to X-rays. Reciprocally, the other elements are masked by a layer which is opaque to the first wavelength and transparent to X-rays. There is thus provision, as shown in FIG. 4, for a mask 60 with a checkerboard pattern of zones which are opaque and transparent with respect to one of the wavelengths. This mask 60 is made in a layer interposed between the layer 34 (the planarization polyimide) and the photodiodes. There is provision for another mask 62 with a checkerboard pattern of zones which are opaque and transparent with respect to the other wavelength. This mask 62 consists of a layer interposed between the upper surface of the photosensitive elements and the upper scintillator 48. This structure enables the gathering of more information, for processing images, than if only one scintillating substance were to be used for the layers 32 and 48. In particular, in medical X-ray technology, this structure can be used to process images of the human body in order to remove the skeleton from these images.

What is claimed is:

1. A device for the conversion of images into electrical signals comprising, firstly, a matrix arrangement of photosensitive elements formed on an insulating substrate and, secondly, a scintillating substance, wherein said scintillating substance is interposed between said substrate and the matrix of photosensitive elements, said matrix being formed as a non-self-supporting superposition of patterned layers deposited on the substrate and wherein an insulating planarization layer is interposed between the scintillating substance and the deposited layers of the matrix.

2. A device according to claim 1, wherein the insulating planarization layer is made of polyimide.

3. A device according to claim 1 or 2, wherein the scintillating layer is a sheet of resin charged with a scintillation powder, said sheet being bonded to the substrate.

4. A device according to claim 1 or 2, wherein the scintillating layer is formed from a mixture of a binder and a scintillating powder, said mixture being deposited on the substrate and then annealed.

5. A device according to claim 1, further comprising a layer reflecting the wavelengths emitted by the scintillating layer, said reflecting layer being interposed between the substrate and the scintillating layer.

6. A device for the conversion of images into electrical signals comprising, firstly, a photosensitive detector formed on an insulating substrate and, secondly, a first scintillating layer, wherein said first scintillating layer is interposed between said substrate and the detector, and further comprising another scintillating layer bonded to or pressed against the upper surface of the photosensitive detector.

7. A device according to claim 6, wherein the first and second scintillating layers are sensitive to different incident radiation wavelengths.

8. A device according to claim 7, wherein the photosensitive detector is a strip or matrix of photosensitive elements, wherein the two scintillators emit different wavelengths and wherein there is provided a first mask interposed between the first scintillating layer and the detector, and a second mask interposed between the second scintillating layer and the detector, the first mask comprising opaque zones and transparent zones with respect to one of the emitted wavelengths, and the second mask comprising opaque zones and transparent zones with respect to the other wavelength, the opaque zones of the masks being alternated to assign every other photosensitive element to the detection of one of the two wavelengths.

* * * * *